(12) United States Patent
Kwon

(10) Patent No.: US 9,996,202 B2
(45) Date of Patent: Jun. 12, 2018

(54) ELECTRONIC DEVICE INCLUDING ITO ELECTRODE PATTERN AND MANUFACTURING METHOD THEREOF

(71) Applicant: Samsung Electronics Co., Ltd., Gyeonggi-do (KR)

(72) Inventor: Ohhyuck Kwon, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 154 days.

(21) Appl. No.: 14/725,604

(22) Filed: May 29, 2015

(65) Prior Publication Data

US 2015/0346868 A1    Dec. 3, 2015

(30) Foreign Application Priority Data

May 30, 2014   (KR) .................. 10-2014-0066350

(51) Int. Cl.
*G06F 3/044* (2006.01)
*G06F 3/041* (2006.01)
*C03C 17/245* (2006.01)
*H01L 31/18* (2006.01)

(52) U.S. Cl.
CPC .......... *G06F 3/044* (2013.01); *C03C 17/2453* (2013.01); *G06F 3/0412* (2013.01); *H01L 31/1884* (2013.01); *C03C 2217/231* (2013.01); *C03C 2218/328* (2013.01); *G06F 2203/04101* (2013.01); *G06F 2203/04103* (2013.01); *G06F 2203/04112* (2013.01)

(58) Field of Classification Search
CPC .................. G06F 3/044; G06F 3/0412; G06F 2203/04101; G06F 2203/04112; G06F 2203/04103

USPC ................................................... 345/173–179
See application file for complete search history.

(56) References Cited

U.S. PATENT DOCUMENTS

| | | | | | |
|---|---|---|---|---|---|
| 4,686,332 | A | * | 8/1987 | Greanias | G06F 3/044 345/173 |
| 4,931,782 | A | * | 6/1990 | Jackson | G06F 3/0414 178/18.01 |
| 7,439,466 | B2 | * | 10/2008 | Yamaue | G06F 3/045 200/512 |
| 7,830,366 | B2 | * | 11/2010 | Tanabe | G06F 3/041 178/18.05 |
| 8,049,127 | B2 | * | 11/2011 | Yamaue | G06F 3/045 200/512 |
| 8,223,135 | B2 | * | 7/2012 | Hayashi | G06F 3/045 345/173 |
| 8,519,271 | B2 | * | 8/2013 | Oikawa | H05K 3/361 174/250 |
| 8,570,055 | B2 | * | 10/2013 | De Boer | G01B 7/023 324/658 |
| 9,092,129 | B2 | * | 7/2015 | Abdo | G06F 3/0488 |
| 9,425,496 | B2 | * | 8/2016 | Zhu | H01Q 1/243 |
| 2002/0145701 | A1 | * | 10/2002 | Sun | G02F 1/134309 349/200 |

(Continued)

*Primary Examiner* — Lun-Yi Lao
*Assistant Examiner* — Kelly Hegarty
(74) *Attorney, Agent, or Firm* — The Farrell Law Firm, P.C.

(57) ABSTRACT

An electronic device having an electrode pattern for a touch sensor is provided. The electronic device include a touch sensor; and a touch key that is formed at a position corresponding to the electrode pattern for the touch sensor and corresponds to a touch region. The electrode pattern is an Indium Tin Oxide (ITO) pattern.

12 Claims, 7 Drawing Sheets

(56) References Cited

U.S. PATENT DOCUMENTS

| | | | | |
|---|---|---|---|---|
| 2004/0051699 A1* | 3/2004 | Tanabe | G06F 3/045 | 345/173 |
| 2007/0182720 A1* | 8/2007 | Fujii | G06F 3/0416 | 345/173 |
| 2008/0170041 A1* | 7/2008 | Inoue | G06F 3/045 | 345/173 |
| 2009/0038683 A1* | 2/2009 | Walter | H01L 51/0015 | 136/263 |
| 2010/0214233 A1* | 8/2010 | Lee | G06F 3/044 | 345/173 |
| 2010/0231241 A1* | 9/2010 | Mueck | G01D 1/00 | 324/686 |
| 2012/0223912 A1 | 9/2012 | Kim | | |
| 2012/0256850 A1* | 10/2012 | Hu | H01Q 1/243 | 345/173 |
| 2012/0309310 A1* | 12/2012 | Greuet | H04B 5/0081 | 455/41.1 |
| 2013/0078917 A1* | 3/2013 | Cho | H01Q 1/243 | 455/41.1 |
| 2013/0093681 A1* | 4/2013 | Hsu | H03K 17/9622 | 345/168 |
| 2013/0201122 A1* | 8/2013 | Kurashima | G06F 3/041 | 345/173 |
| 2013/0314632 A1* | 11/2013 | Zohrabyan | G02F 1/29 | 349/36 |
| 2014/0049682 A1* | 2/2014 | Galstian | G02B 7/38 | 348/356 |
| 2014/0218641 A1* | 8/2014 | Chen | G06F 3/041 | 349/12 |
| 2014/0253454 A1* | 9/2014 | Caldwell | G06F 3/0219 | 345/168 |
| 2015/0092120 A1* | 4/2015 | Wang | G06F 3/041 | 349/12 |
| 2015/0199023 A1* | 7/2015 | Hu | G06F 3/0213 | 345/173 |
| 2015/0242029 A1* | 8/2015 | Kim | G06F 3/044 | 345/173 |
| 2015/0248603 A1* | 9/2015 | Lowenthal | G06K 19/06112 | 235/375 |
| 2015/0277634 A1* | 10/2015 | Oem | G06F 3/044 | 345/173 |

\* cited by examiner

_US 9,996,202 B2_

ELECTRONIC DEVICE INCLUDING ITO ELECTRODE PATTERN AND MANUFACTURING METHOD THEREOF

PRIORITY

The present invention claims priority under 35 U.S.C. § 119(a) to Korean Patent Application No. 10-2014-0066350, filed in the Korean Intellectual Property Office on May 30, 2014, the entire content of which is incorporated herein by reference.

BACKGROUND

1. Field of the Invention

The present invention generally relates to forming an electrode pattern for a touch sensor through Indium Tin Oxide (ITO) sputtering, and more particularly, to an electronic device including an electrode pattern for a touch sensor that is formed by cutting an ITO-sputtered portion with a laser, and a method of manufacturing the same.

2. Description of the Related Art

Touch screen panels are device elements for inputting a user's instruction by touching a person's finger or another touch unit to a screen to input a text or a figure displayed on the screen of an image displaying device. The touch screen panels are used while being mounted on the image displaying device. The touch screen panels convert a touch point, which the person's finger touches, into an electric signal, and the converted electric signal is used as an input signal.

Recently, various input keys have been installed in a region other than an image display region of a touch screen. Although physical keys have been generally formed, touch keys have recently been installed for the reasons of cost reduction and simplicity of design. That is, electronic devices have been developed to include a touch key, and the touch key is implemented on a touch screen panel other than an image display region so that a user's touch input is possible.

Capacitive type (C-type) touch screen panels detect an electrostatic capacity change caused by a touch (a direct or indirect touch) to determine whether the touch is made. Metal, such as silver or copper, with which a pattern is printed through printing, is generally used to manufacture an electrode pattern for a touch sensor that detects a change in electrostatic capacity. A desired pattern shape may be manufactured by printing a touch region, with metal on the electrode pattern for a touch sensor.

However, electronic devices, in particular portable terminals having a communication function, have various types and shapes of antennas mounted therein, and therefore an electronic pattern for a touch sensor that is formed of silver or copper acts as a noise source during the radiation of the antennas, thereby degrading the radiation performance of the antennas. Since the electrode pattern for a touch sensor that is formed of silver or copper has an influence on the performance or sensitivity of the antennas as described above, there is a space limitation in that an antenna pattern has to be formed at a location where interference due to the electrode pattern for a touch sensor can be avoided.

Furthermore, in order to form an electrode pattern with silver or copper in a touch region, a process of printing silver or copper is required.

SUMMARY

The present invention has been made to solve at least the above-mentioned problems and/or disadvantages and to provide at least the advantages described below.

Accordingly, an aspect of the present invention is to substitute an existing process of forming an electrode pattern for a touch sensor through metal printing with an ITO pattern process, thereby making it possible to replace a silver pattern acting as a noise source of an antenna and omit the existing metal pattern printing process to economically manufacture an electrode pattern for a touch sensor.

In accordance with an aspect of the present invention, an electronic device having an electrode pattern for a touch sensor is provided. The electronic device includes a touch sensor; and a touch key that is formed at a position corresponding to the electrode pattern for a touch sensor and corresponding to a touch region, in which the electrode pattern is an ITO pattern.

In accordance with another aspect of the present invention, a method of manufacturing an electronic device having an electrode pattern for a touch sensor is provided. The method includes forming an ITO pattern through ITO sputtering; and cutting the electrode pattern with a laser to divide the ITO pattern into a main electrode pattern that is the electrode pattern for the touch sensor, an outer pattern located along an outer periphery of the main electrode pattern, and an inner pattern located inside the main electrode pattern.

BRIEF DESCRIPTION OF THE DRAWINGS

The above and other aspects, features, and advantages of certain embodiments of the present invention will be more apparent from the following description, taken in conjunction with the accompanying drawings, in which.

DETAILED DESCRIPTION OF EMBODIMENTS OF THE PRESENT INVENTION

Figure 1:
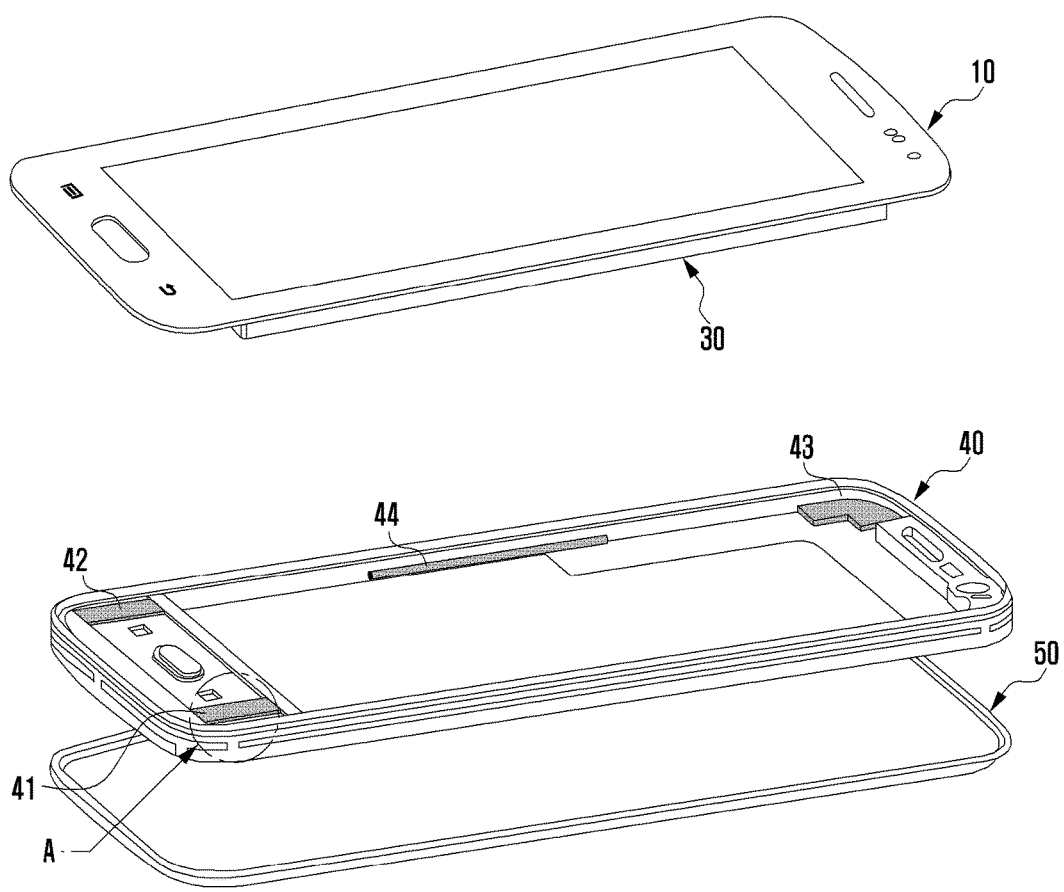
FIG. 1 is an exploded perspective view of an electronic device according to an embodiment of the present invention.

Hereinafter, the present invention will be described with reference to the accompanying drawings. The present invention may have various embodiments, and modifications and changes may be made therein. Therefore, the present invention will be described in detail with reference to particular embodiments shown in the accompanying drawings. However, it should be understood that it is not intended to limit the present invention to the particular forms, and the present invention should be construed to cover all modifications, equivalents, and/or alternatives falling within the spirit and scope of the present invention. In describing the drawings, similar elements are designated by similar reference numerals.

As used in the present disclosure, the expressions "include" or "may include" or "can include" refer to the existence of a corresponding function, operation, or constituent element, and does not limit one or more additional functions, operations, or constituent elements. Further, as used in the present disclosure, the terms such as "include" or "have" may be construed to denote a certain characteristic, number, step, operation, constituent element, component or a combination thereof, but do not be construed to exclude the existence of or a possibility of addition of one or more other characteristics, numbers, steps, operations, constituent elements, components or combinations thereof.

As used in the present disclosure, the expression "and/or" includes any or all combinations of words enumerated together. For example, the expressions "A or B" or "at least one of A and B" may include A, may include B, or may include both A and B.

While expressions including ordinal numbers, such as "first" and "second", as used in the present disclosure may modify various constituent elements, such constituent elements are not limited by the above expressions. For example, the above expressions do not limit the sequence and/or importance of the corresponding constituent elements. The above expressions may be used merely for the purpose of distinguishing a constituent element from other constituent elements. For example, a first user device and a second user device indicate different user devices although both are user devices. For example, a first constituent element may be referred as to a second constituent element, and likewise a second constituent element may also be referred as to a first constituent element without departing from the scope of the present invention.

When a component is referred to as being "connected" or "accessed" to any other component, it should be understood that the component may be directly connected or accessed to the other component, but another new component may also be interposed between them. On the contrary, when a component is referred to as being "directly connected" or "directly accessed" to any other component, it should be understood that there is no new component between the component and the other component.

The terms as used in various embodiments of the present invention are merely for the purpose of describing particular embodiments and are not intended to limit the present invention. Singular forms are intended to include plural forms unless the context clearly indicates otherwise.

Unless defined otherwise, all terms used herein, including technical terms and scientific terms, have the same meaning as commonly understood by a person of ordinary skill in the art to which the present invention pertains. Terms such as those defined in a generally used dictionary are to be interpreted to have the same meanings as the contextual meanings in the relevant field of art, and are not to be interpreted to have ideal or excessively formal meanings unless clearly defined in the present disclosure.

In this disclosure, an electronic device is a device that involves a smart phone, for example, a capacitive type touch sensor.

A touch key is formed at a position corresponding to an electrode pattern for a touch sensor and guides a user's touch input. That is, the touch key is in a predetermined region for receiving a touch signal. When the user uses his/her finger to touch the touch key, the finger is placed on the electrode pattern for the touch sensor, and the finger touch causes a change in the electrostatic capacity of the electrode pattern for the touch sensor. The capacitive type touch key recognizes a touch signal through the electrostatic capacity change.

FIG. 1 is an exploded perspective view of an electronic device according to an embodiment of the present invention. Referring to FIG. 1, the electronic device, according to an embodiment of the present invention, includes a Touch Screen Panel (TSP) 10, a display unit 30, a body 40, and a rear cover 50.

The body 40 has various components mounted thereto for operating the touch screen panel 10 and the display unit 30. The rear cover 50 may be detachably coupled to the body 40, and a battery for supplying electric power to the electronic device may be mounted between the body 40 and the rear cover 50.

The electronic device having various communication functions may include a variety of antennas 41, 42, 43, and 44. Due to the compactness of the electronic device, the antennas 41, 42, 43, and 44 tend to be installed near the frame of the electronic device.

Figure 2:
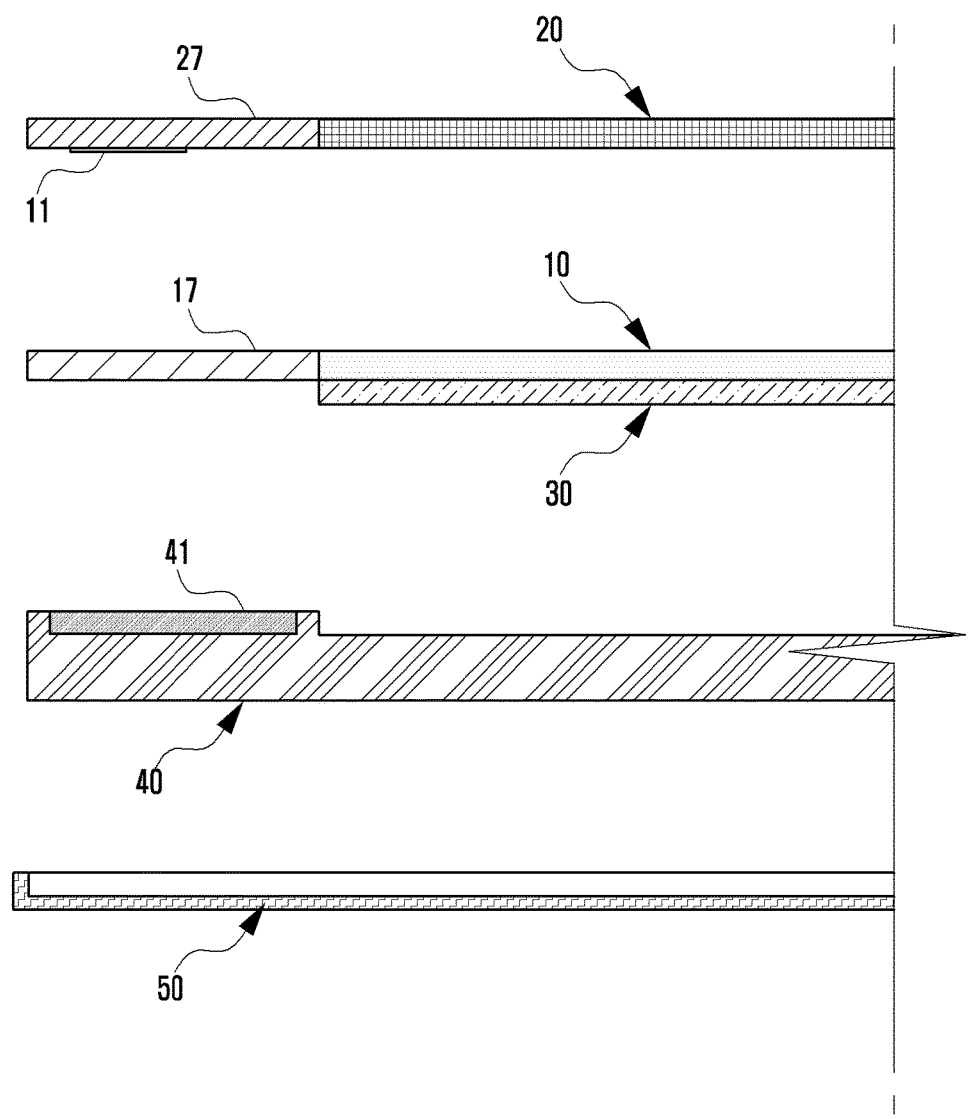
FIG. 2 is a sectional view illustrating region A of FIG. 1.

FIG. 2 is a sectional view illustrating region A of FIG. 1.

The electronic device, according to an embodiment of the present invention, may include a window 20 on the front surface of the touch screen panel 10 to protect the touch screen panel 10. The window 20 may be manufactured with a film or glass for protecting the touch screen panel 10. The window 20 may include a display region 26 for allowing the displayed content on the display unit 30 to be seen and a black mark region 27 formed around the display region 26. The touch screen panel 10 may include a display region 16 for allowing the displayed content on the display unit 30 to be seen and a black mark region 17 formed around the display region 16. The display region 26 of the window 20 is formed at the position corresponding to the display region 16 of the touch screen panel 10, that is, when coupled, the display region 26 and the display region 16 are matched with each other. The display region 16 is a transparent conductive layer, and the black mark region 17 is opaque. The black mark region 17 has a conductive pattern that is printed on the top surface thereof and connected to an electrode pattern 11 for a touch sensor, and may include a multilayer Flexible Printed Circuit Board (FPCB) that has multiple layers stacked one above another.

Referring to FIG. 2, the window 20 is stacked on the top of the touch screen panel 10, and the display unit 30 is disposed on the bottom of the touch screen panel 10. The antenna 41 may be disposed in a particular region of the body 40. In some cases, the antenna 41 may also be disposed very close to an electrode pattern 11 for a touch sensor as illustrated in FIG. 2, and even in this case, the performance of the antenna 41 may not be degraded by using ITO. The electrode pattern 11 for a touch sensor may be disposed on the rear surface of the black mark region 27 that is formed around the display region 26.

Figure 3:
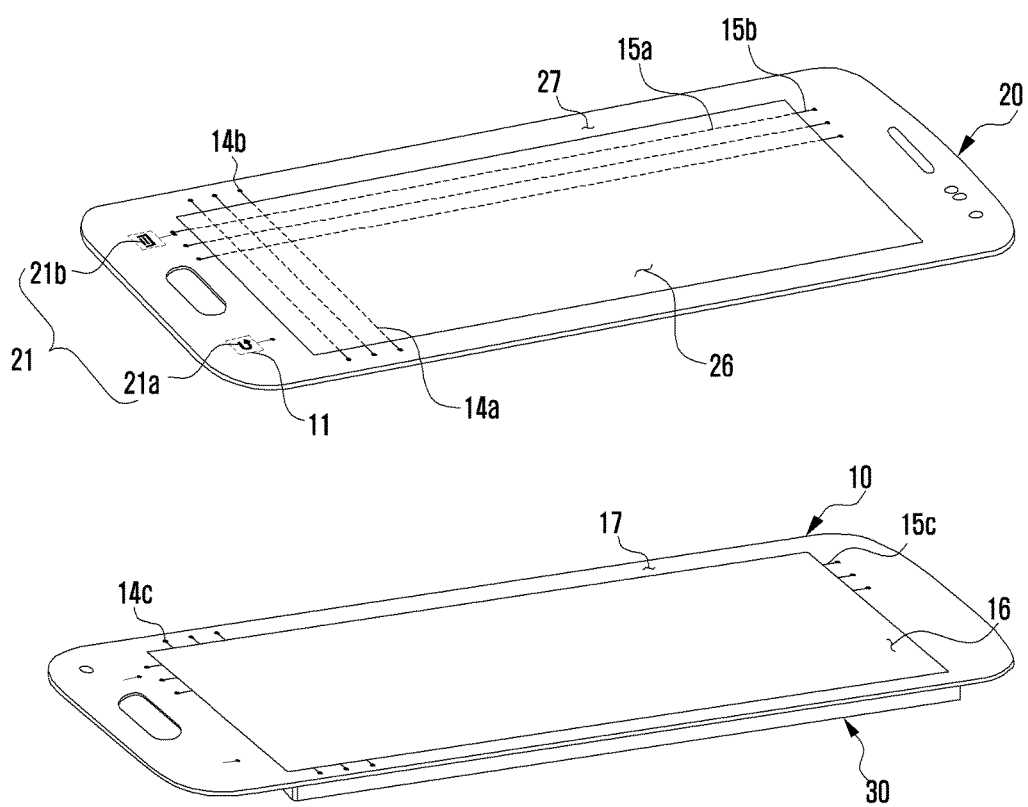
FIG. 3 is an exploded perspective view of a touch screen panel according to an embodiment of the present invention.

FIG. 3 is an exploded perspective view of a touch screen panel according to an embodiment of the present invention.

Referring to FIG. 3, transparent electrodes 14a and 15a may be formed on the rear surface of the display region 26 of the window 20. When the window 20 is coupled to the touch screen panel 10, the end portions 14b and 15b of the respective transparent electrodes 14a and 15a are connected to an electrode pattern for signal transfer that is formed on a FPCB. The display unit 30 includes a display for displaying content such as images and texts.

Since the plurality of transparent electrodes 14a and 15a are formed on the rear surface of the display region 26 of the window 20 in the vertical and horizontal directions and the display region 16 is a transparent conductive layer, when a touch is made, the touch points are detected by the plurality of transparent electrodes 14a and 15a. The plurality of transparent electrodes 14a and 15a are formed of ITO.

The end portions 14b and 15b of the plurality of transparent electrodes 14a and 15a formed in the display region 26 extend to the black mark region 27 and are formed on the rear surface of the black mark region 27 of the window 20 and connected to electrode patterns 14c and 15c formed on the front surface of the black mark region 17, respectively, to transfer a touch signal to a controller.

The electrode pattern 11 for a touch sensor is also formed on the rear surface of the black mark region 27 of the window 20. The electrode pattern 11 for a touch sensor is a touch sensor of a capacitive type (C-type) that recognizes an on-off type touch. The electrode pattern 11 for a touch sensor is positioned between the black mark region 27 of the window 20 and the black mark region 17 of the touch screen panel 10. The position of the electrode pattern 11 for a touch sensor is not limited to the black mark region 17, and the electrode pattern 11 for a touch sensor may also be positioned on the side surface or the rear surface of the electronic device to allow a user to conveniently input a touch.

A touch key 21 corresponding to a touch region is located in the black mark region 27 of the window 20. The touch key 21 is formed on the front surface of the black mark region 27 of the window 20 at a position corresponding to the electrode pattern 11 for a touch sensor formed on the rear surface of the black mark region 27 of the window 20. The touch key 21 may include a plurality of touch keys 21a and 21b. The touch key 21 can receive a touch input. For example, the touch key 21 may receive an on-off touch input.

Figure 4:
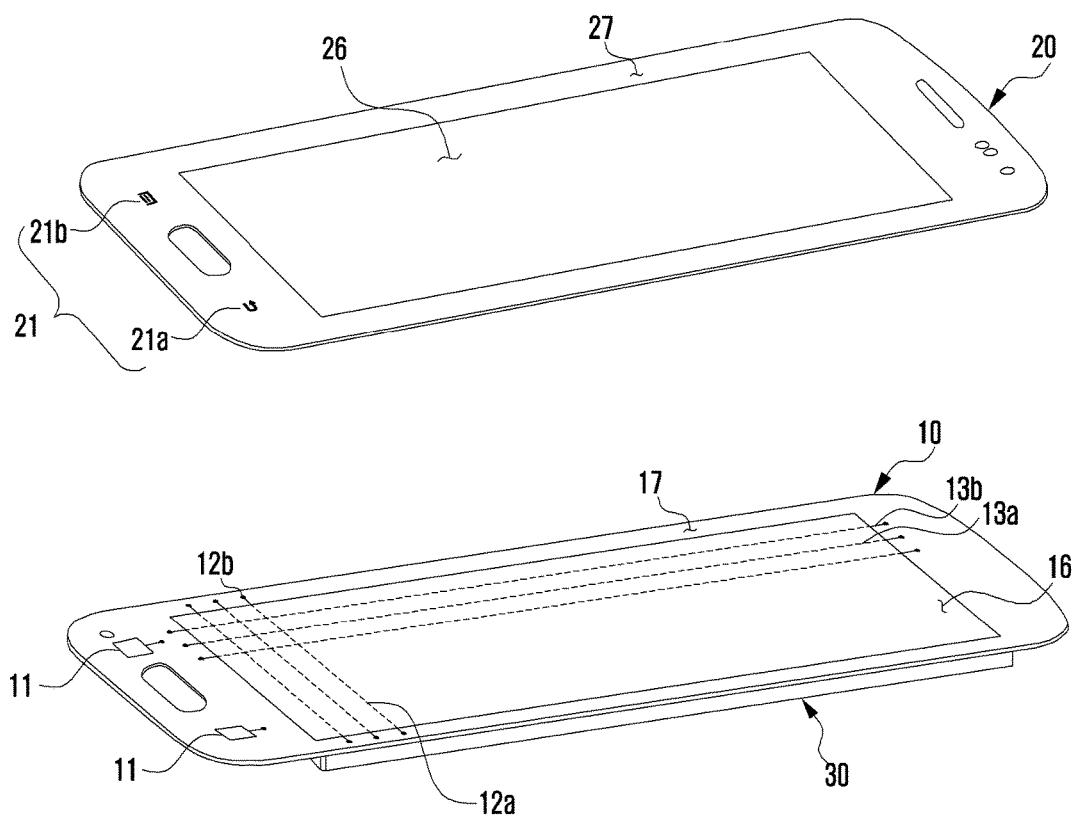
FIG. 4 is an exploded perspective view of a touch screen panel according to another embodiment of the present invention.

FIG. 4 is an exploded perspective view of a touch screen panel 10 according to another embodiment of the present invention. The description of the components similar to those of FIG. 3 will be omitted.

Referring to FIG. 4, a plurality of electrode patterns 12a and 13a are formed in the display region 16 in the vertical and horizontal directions. Since the plurality of electrode patterns 12a and 13a are transparent electrodes and the display region 16 is a transparent conductive layer, when a touch is made, the touch points are detected by the plurality of electrode patterns 12a and 13a. The black mark region 17 is a multilayer FPCB having a plurality of layers stacked one above another, and the plurality of electrode patterns 12b and 13b for signal transfer are formed on the multilayer FPCB.

The end portions 12b and 13b of the plurality of electrode patterns 12a and 13a formed in the display region 16 extend to the black mark region 17 to transfer a touch signal to a controller. An electrode pattern 11 for a touch sensor is formed in the black mark region 17 of the touch screen panel 10.

Figure 5:
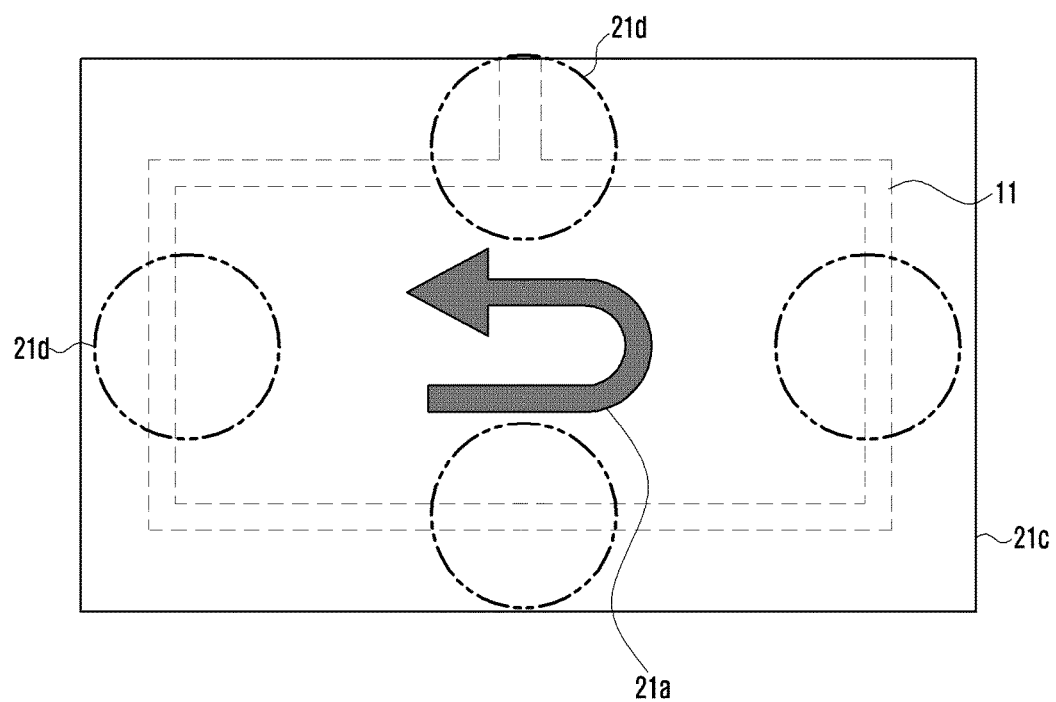
FIG. 5 illustrates a touch key (touch region) according to an embodiment of the present invention.

FIG. 5 illustrates a touch key 21 according to an embodiment of the present invention.

Any one touch key 21, according to an embodiment of the present invention, is formed on the front surface of the window 20 and corresponds to the electrode pattern 11 for a touch sensor which is positioned on the rear surface of the window 20. The touch key 21 corresponds to a region within which an object makes contact.

Referring to FIG. 5, the touch key 21a has a predetermined touch region 21c. That is, when touches are made in a predetermined region, the same touch signal is transferred. An object (a finger, etc.) has to be placed on a position corresponding to the electrode pattern 11 for a touch sensor in order that the electrode pattern 11 for a touch sensor transfers a touch signal to the controller. When the electrode pattern 11 for a touch sensor overlaps with a contact portion 21d of the object, the touch signal is transferred to the controller, if a touch is made in the predetermined touch region 21c. Accordingly, the electrode pattern 11 for a touch sensor corresponds to a predetermined touch range.

The electrode pattern 11 for a touch sensor may be formed in a loop pattern of a closed shape to have a predetermined touch range.

Figure 6:
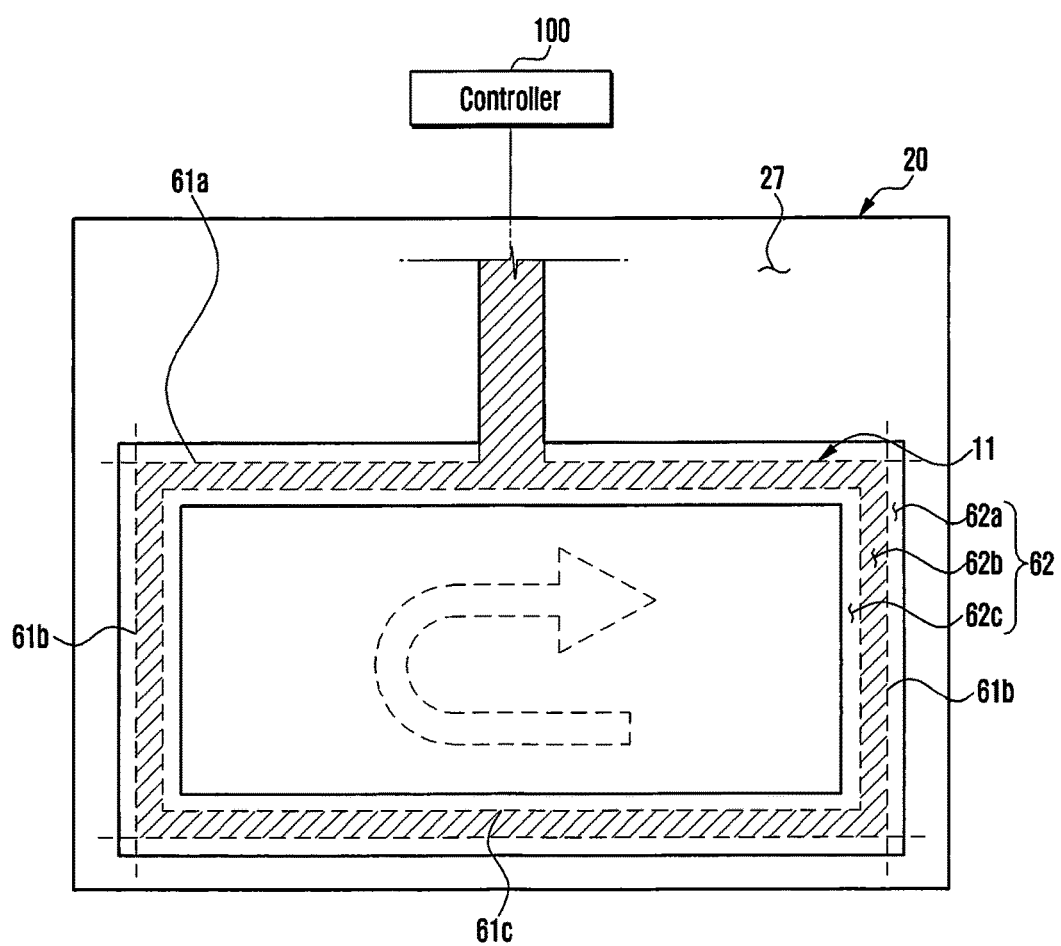
FIG. 6 illustrates an ITO pattern according to an embodiment of the present invention, in which the outer and inner peripheries thereof are cut with a laser.

FIG. 6 illustrates an ITO pattern 62 according to an embodiment of the present invention, in which the outer and inner peripheries thereof are cut with a laser.

Figure 7:
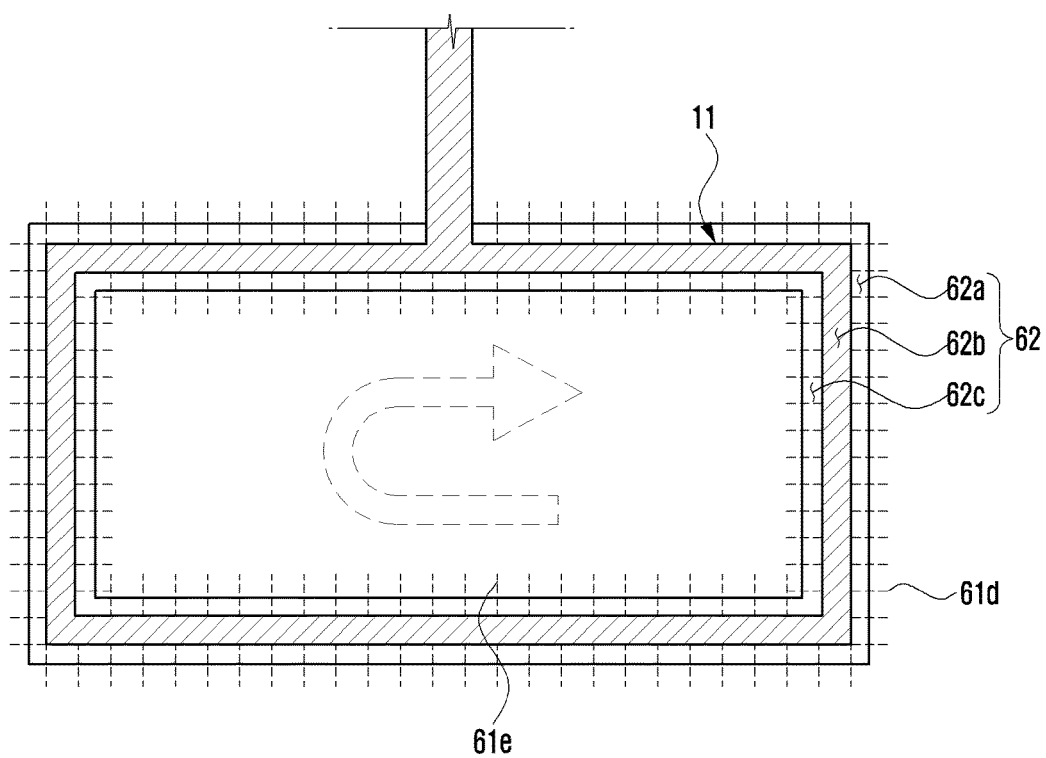
FIG. 7 illustrates an ITO pattern according to an embodiment of the present invention, in which an outer pattern and an inner pattern thereof are cut with a laser into a plurality of patterns.

FIG. 7 illustrates an ITO pattern 62 according to an embodiment of the present invention, in which an outer pattern 62a and an inner pattern 62c thereof are cut with a laser into a plurality of patterns.

The electrode pattern 11 for a touch sensor is formed in the black mark region 27 of the window 20 through ITO sputtering. However, since ITO sputtering does not have high precision, it is difficult to manufacture the electrode pattern 11 for a touch sensor with a desired width through ITO sputtering. Accordingly, a desired shape of electrode pattern 11 for a touch sensor may be obtained by cutting unnecessary portions with a laser after the ITO pattern is formed through ITO sputtering.

The outer and inner peripheries of the electrode pattern 11 for a touch sensor which is formed through ITO sputtering may act as a noise source of an antenna. Accordingly, it is necessary to prevent the outer and inner peripheries of the electrode pattern 11 for a touch sensor from operating as a conductor.

Referring to FIG. 6, the ITO pattern 62 may be separated into an outer pattern 62a, a main electrode pattern 62b, and an inner pattern 62c.

Among the outer pattern 62a, the main electrode pattern 62b, and the inner pattern 62c, the main electrode pattern 62b may operate as the electrode pattern 11 for a touch sensor transferring a signal to the controller 100, and the outer and inner patterns 62a and 62c are dummies that cannot transfer a signal. The outer pattern 62a and the main electrode pattern 62b are not electrically connected to each other. The inner pattern 62c and the main electrode pattern 62b are not electrically connected to each other. The outer and inner patterns 62a and 62c are not electrically connected to each other.

Laser cutting is used to individually separate the outer pattern 62a, the main electrode pattern 62b, and the inner pattern 62c. The main electrode pattern 62b and the outer pattern 62a are formed by uniformly cutting the outer peripheral portion of the ITO pattern 62 with a laser, for example, by cutting along a horizontal cutting line 61a and one side of vertical cutting lines 61b. In the same way, the main electrode pattern 62b and the inner pattern 62c are separated from each other by cutting along a horizontal cutting line 61c and the other side of vertical cutting lines 61b.

Because the main electrode pattern 62b corresponds to the electrode pattern 11 for a touch sensor and operates as a touch sensor, and the outer and inner patterns 62a and 62c do not operate as a touch sensor, but may have an influence on the radiation of an antenna, the outer and inner patterns 62a and 62c are removed in order to minimize the radiation of the antenna.

Referring to FIG. 7, there exist laser cutting lines 61d and 61e for dividing the outer and inner patterns 62a and 62c, respectively, into a plurality of patterns. That is, the outer and inner patterns 62a and 62c are cut with a laser at an equal interval. The outer and inner patterns 62a and 62c are finely cut through laser cutting in order to minimize an effect on the radiation of the antenna. First, touch performance necessary for a touch input is ensured by using the horizontal cutting line 61*a* and 61*c* and the vertical cutting lines 61*b* from the main electrode pattern 62*b* which corresponds to the electrode pattern 11 for a touch sensor. Second, the outer and inner patterns 62*a* and 62*c* are cut in the width direction thereof in order to prevent the outer and inner patterns 62*a* and 62*c* from operating as a conductor and having an influence on a touch input. Hereinafter, a method of manufacturing the electrode pattern 11 for a touch sensor will be described.

The electrode pattern for a touch sensor is manufactured through a pattern forming step, a first cutting step, and a second cutting step.

In the pattern forming step, an ITO pattern is formed on a surface of a window glass or on a surface of a FPCB through ITO sputtering. The pattern forming step includes a step of removing unnecessary portions of the ITO pattern with ITO etching paste after the ITO sputtering. The ITO etching paste can remove an ITO pattern portion, but cannot remove an electrode pattern portion within a fine range. Laser cutting is additionally performed for a portion that cannot be removed due to a narrow space thereof. That is, the unnecessary portions of the ITO pattern are separated from a conductive region through the laser cutting and thus may be removed from the ITO pattern.

In the first cutting step, the ITO pattern is divided by laser cutting into a main electrode pattern, an outer pattern located along the outer periphery of the main electrode pattern, and an inner pattern located inside the main electrode pattern. The main electrode pattern is a region through which electricity passes and functions as a touch sensor. That is, a desired shape of electrode pattern for a touch sensor may be obtained by manufacturing the main electrode pattern from the ITO pattern.

The first cutting step of the electrode pattern prevents the main electrode pattern and the inner pattern from being electrically connected to each other.

The second cutting step is carried out after the first cutting step. The second cutting step of the outer pattern divides the outer pattern into a plurality of patterns. In addition, in the second cutting divides the inner pattern with a laser into a plurality of patterns.

The method of manufacturing the electrode pattern may include a pattern removing step after the first and second cutting steps. The pattern removing step of removes the cut outer and inner patterns.

The following experiments were conducted to identify a performance difference between an existing silver pattern and an ITO pattern.

While a portable terminal having an electrode pattern for a touch sensor formed therein, according to the present invention, was placed on a person's torso and held by one hand, radiation performance was measured for the electrode pattern for a touch sensor and an antenna.

Experiment 1

When an existing silver pattern was cut in with an embodiment of the present disclosure, in a predetermined frequency of telecommunicatons networks, a first band signal was measured to be 18.50 dB on the average, and a second band signal was measured to be 18.60 dB on the average. By contrast, when an ITO pattern was cut, a first band signal was measured to be 18.25 dB on the average, and a second band signal was measured to be 19.20 dB on the average. From this experiment, it could be noted that the touch sensitivity is similar for these two materials, and the sensitivity of the antenna is increased for ITO, compared with silver.

Experiment 2

When an ITO pattern was not cut with a laser, a first band signal was measured to be 18.01 dB on the average, and a second band signal was measured to be 18.30 dB on the average. By contrast, when an ITO pattern was cut with a laser, a first band signal was measured to be 18.29 dB on the average, and a second band signal was measured to be 19.26 dB on the average. From this experiment, it could be noted that when the outer and inner portions of the electrode pattern for a touch sensor are not cut and removed, the outer and inner portions act as a noise source of the antenna. When outer and inner portions of an electrode pattern for a touch sensor are removed, the electrode pattern for a touch sensor may have a minor effect on an antenna.

Considering that the laser cutting is required for an ITO that cannot be removed using the etching paste and required for cutting another electrode pattern on an FPCB, when the main electrode pattern is separated from the outer and inner patterns through the laser cutting, the same effect may be obtained as removing unnecessary portions of the ITO electrode pattern even without a separate additional process.

The electrode pattern 11 for a touch sensor, according to the various embodiments of the present invention, may be applied to various electronic devices for example, a tablet Personal Computer (PC) through which an on-off touch input is possible.

As described above, according to the electronic device of the present invention, compared with an existing electrode pattern for a touch sensor manufactured of silver, an ITO electrode pattern can be implemented at the same level of touch sensitivity even without adding or changing a process in the existing process, and the performance of an antenna can be increased at the same time.

According to the present invention, it is possible to prevent the electrode pattern around the antenna from acting as a noise source, place the antenna near the electrode pattern for a touch sensor, and increase a degree of freedom of antenna design while ensuring the touch performance and region without introducing an additional process.

In addition, a metal pattern printing process can be omitted, compared with the existing electrode pattern for a touch sensor, thereby economically forming the electrode pattern for a touch sensor.

Although the present invention has been described with reference to certain embodiments, various changes and modifications may be made by one skilled in the art. It is intended that the present invention encompass such changes and modifications as fall within the scope of the appended claims and their equivalents.

What is claimed is:

1. An electronic device comprising:
    an electrode;
    an electronic component having one surface on which the electrode is disposed;
    a controller; and
    a touch key,
    wherein the electrode is made of Indium Tin Oxide (ITO) and comprises:
        a first electrode pattern formed along a circumference of one area of the one surface, the one area corresponding to the touch key;

a second electrode pattern formed along an outer circumference of the first electrode pattern and the circumference of the one area; and a third electrode pattern formed along an inner circumference of the first electrode pattern and the circumference of the one area, wherein the first electrode pattern is formed to be electrically connected to the controller to transfer a touch signal to the controller wherein the second electrode pattern and the third electrode pattern are formed to be electrically disconnected from the controller, and wherein the first electrode pattern and the second electrode pattern are electrically disconnected from each other, and the first electrode pattern and the third electrode pattern are electrically disconnected from each other.

2. The electronic device of claim 1, further comprising:
a touch screen panel that comprises a display region for displaying an image and a black mark region formed around the display region.

3. The electronic device of claim 2,
wherein the electronic component is a window that protects the touch screen panel,
wherein the one surface on which the electrode is formed is a rear surface of the window, and
wherein the touch key is formed on a front surface of the window to correspond to a touch region.

4. The electronic device of claim 2, wherein the black mark region is a multilayer Flexible Printed Circuit Board (FPCB) having a plurality of layers stacked one above another, and the display region is a transparent conductive layer.

5. The electronic device of claim 1, wherein the electrode is a loop pattern having a closed shape.

6. The electronic device of claim 5, wherein the electrode is formed from a sputtered ITO pattern.

7. The electronic device of claim 6, wherein the sputtered ITO pattern is cut with a laser such that the electrode is divided into the first electrode pattern, the second electrode pattern, and the third electrode pattern.

8. The electronic device of claim 7, wherein the second electrode pattern and the third electrode pattern are cut with the laser into a plurality of sub-electrode patterns that are electrically disconnected from each other.

9. A method of manufacturing an electronic device having a touch key and an electrode, comprising:
forming an Indium Tin Oxide (ITO) pattern through ITO sputtering on one surface of an electronic component; and
cutting the ITO pattern with a laser to form the electrode, wherein the electrode comprises:
a first electrode pattern formed along a circumference of one area of the one surface, the one area corresponding to the touch key;
a second electrode pattern formed along an outer circumference of the first electrode pattern and the circumference of the one area; and
a third electrode pattern formed along an inner circumference of the first electrode pattern and the circumference of the one area,
wherein the first electrode pattern is formed to be electrically connected to a controller of the electronic device to transfer a touch signal to the controller,
wherein the second electrode pattern and the third electrode pattern are formed to be electrically disconnected from the controller, and
wherein the first electrode pattern and the second electrode pattern are electrically disconnected from each other, and the first electrode pattern and the third electrode pattern are electrically disconnected from each other.

10. The method of claim 9, wherein the electrode is cut such that the first electrode pattern has a predetermined region.

11. The method of claim 10, further comprising:
cutting the second electrode pattern and the third electrode pattern with the laser after cutting the ITO pattern, such that the second electrode pattern and the third electrode pattern are divided into a plurality of sub-electrode patterns that are electrically disconnected from each other.

12. The method of claim 9, further comprising:
removing the second electrode pattern and the third electrode pattern.

* * * * *